(12) United States Patent
Shimizu

(10) Patent No.: US 11,708,204 B2
(45) Date of Patent: Jul. 25, 2023

(54) ELECTRONIC COMPONENT ARRAY AND METHOD OF MANUFACTURING ELECTRONIC COMPONENT ARRAY

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 260 days.

(21) Appl. No.: 17/017,744

(22) Filed: Sep. 11, 2020

(65) Prior Publication Data

US 2021/0101730 A1 Apr. 8, 2021

(30) Foreign Application Priority Data

Oct. 7, 2019 (JP) ................... 2019-184235

(51) Int. Cl.
*B65D 75/36* (2006.01)
*B65B 9/04* (2006.01)
(Continued)

(52) U.S. Cl.
CPC .............. *B65D 75/367* (2013.01); *B65B 9/04* (2013.01); *B65B 15/04* (2013.01); *H05K 13/0084* (2013.01); *H05K 13/0419* (2018.08)

(58) Field of Classification Search
CPC ........... H05K 13/0084; H05K 13/0419; B65D 75/367; B65D 85/327; B65D 2575/3245; B65D 73/02

(Continued)

(56) References Cited

U.S. PATENT DOCUMENTS 6,469,372 B2 * 10/2002 Hayden ............. H01L 21/67132
257/679
6,547,076 B1 * 4/2003 Pylant .................. B65D 75/327
206/713

(Continued)

FOREIGN PATENT DOCUMENTS

| CN | 109747972 A | 5/2019 |
|---|---|---|
| JP | 3928127 B2 | 6/2007 |
| JP | 2008-222256 A | 9/2008 |

OTHER PUBLICATIONS

Official Communication issued in corresponding Chinese Patent Application No. 202011019705.X, dated Mar. 3, 2022.

*Primary Examiner* — Chun Hoi Cheung
(74) *Attorney, Agent, or Firm* — Keating & Bennett, LLP

(57) ABSTRACT

An electronic component array includes a base tape including paper and having approximately elongated and substantially planar shape, the base tape being provided with a plurality of accommodation recesses provided in a longitudinal direction of the base tape; a plurality of electronic components; and a cover tape. The electronic component array includes a first bonding portion in which openings of the respective accommodation recesses are covered by the cover tape in a state where the electronic components are included in the respective accommodation recesses, and a second bonding portion in which openings of the respective accommodation recesses are covered by the cover tape in a state where the electronic components are not included in the respective accommodation recesses. A peel strength of the second bonding portion is about 10% or more and about 70% or less of a peel strength of the first bonding portion.

9 Claims, 11 Drawing Sheets

(51) Int. Cl.
*B65B 15/04* (2006.01)
*H05K 13/00* (2006.01)
*H05K 13/04* (2006.01)

(58) Field of Classification Search
USPC .................................................. 206/713–717
See application file for complete search history.

(56) References Cited

U.S. PATENT DOCUMENTS

| | | | | |
|---|---|---|---|---|
| 7,584,853 | B2* | 9/2009 | Yoshii | H05K 13/0084 206/813 |
| 8,584,859 | B2* | 11/2013 | Hiramatsu | H05K 13/0084 428/355 R |
| 8,875,895 | B2* | 11/2014 | Sasamura | H05K 13/0084 206/713 |
| 2007/0074996 | A1* | 4/2007 | Nice | H05K 13/0084 206/714 |
| 2008/0000804 | A1* | 1/2008 | Carey | H05K 13/0084 206/714 |
| 2009/0123695 | A1* | 5/2009 | Han | H05K 13/0084 428/134 |
| 2013/0193016 | A1* | 8/2013 | Sasamura | B65D 85/00 206/389 |

* cited by examiner

CROSS-SECTIONAL VIEW
TAKEN ALONG LINE IV-IV

CROSS-SECTIONAL VIEW
TAKEN ALONG LINE V-V

CROSS-SECTIONAL VIEW
TAKEN ALONG LINE VI-VI

CROSS-SECTIONAL VIEW
TAKEN ALONG LINE X-X

CROSS-SECTIONAL VIEW
TAKEN ALONG LINE XIII-XIII

CROSS-SECTIONAL VIEW
TAKEN ALONG LINE XIV-XIV

ELECTRONIC COMPONENT ARRAY AND METHOD OF MANUFACTURING ELECTRONIC COMPONENT ARRAY

CROSS REFERENCE TO RELATED APPLICATIONS

This application claims the benefit of priority to Japanese Patent Application No. 2019-184235 filed on Oct. 7, 2019. The entire contents of this application are hereby incorporated herein by reference.

BACKGROUND OF THE INVENTION

1. Field of the Invention

The present invention relates to an electronic component array including electronic components and a method of manufacturing the electronic component array.

2. Description of the Related Art

In recent years, in a process of manufacturing various types of electronic devices, a mounting machine is used for mounting various types of electronic components on a circuit substrate. On this mounting machine, a reel is set in the state where an electronic component array accommodating electronic components is wound around this reel. This electronic component array is formed of a base tape provided with accommodation recesses that accommodate respective electronic components; and a cover tape for covering the accommodation recesses. Some base tapes may be made of paper made from wood pulp as a main material, and such a base tape is formed of multiple layers.

When a reel around which such an electronic component array is wound is set in a tape feeder of the mounting machine, an operator needs to manually peel off a cover tape to the position of a leader portion that is located at the leading end of the electronic component array and that has accommodation recesses accommodating respective electronic components. This leader portion is located on the outermost circumference in the state where the electronic component array is wound around the reel. Accordingly, this leader portion is more likely to be influenced by its external environment (temperature, humidity) and the handling operation (stress), and thus, tends to be readily increased in peel strength over time as compared with other portions.

Accordingly, in the above-described manual operation by the operator, depending on the angle and the speed at which the cover tape is peeled, a trouble may occur that the entire upper layer portion of the base tape is peeled off when the cover tape is peeled off at the leader portion. This brings the mounting machine into an error state, and thus, electronic components cannot be mounted any more, with the result that a new reel has to be set again.

It is generally considered that peeling-off of the upper layer portion of the base tape that causes such an error in the mounting machine originates from fuzz that is caused during peeling-off of the cover tape. Thus, in order to suppress such peeling-off of the upper layer portion of the base tape, a carrier tape made of paper as disclosed in Japanese Patent No. 3928127 has been proposed.

Carrier tape paper disclosed in Japanese Patent No. 3928127 aims to achieve both: suppression of fuzz; and stable adhesiveness of a cover tape, by adjusting "blending of hardwood pulp (an L material) and softwood pulp (an N material)" and the like of the paper tape material. Also, the ratio of raw materials between hardwood pulp/softwood pulp is set at 80/20 to 100/0, thereby allowing suppression of fuzz and stable adhesiveness of the cover tape. In this way, in order to suppress peeling-off of the upper layer portion of the base tape, the pulp blending ratio in the base tape needed to be managed such that the ratio of the N material is relatively low.

SUMMARY OF THE INVENTION

Preferred embodiments of the present invention provide electronic component arrays and methods of manufacturing the electronic component arrays, by which peeling-off of an upper layer portion of a base tape is able to be significantly reduced or prevented even upon peeling-off of a cover tape from the base tape, without depending on the blending ratio between the N material and the L material.

An electronic component array according to a preferred embodiment of the present invention includes a base tape including paper and having an elongated and substantially planar shape, the base tape being provided with a plurality of accommodation recesses provided in a longitudinal direction of the base tape; a plurality of electronic components; and a cover tape. The electronic component array includes a first bonding portion in which openings of the respective accommodation recesses are covered by the cover tape in a state where the electronic components are included in the respective accommodation recesses, and a second bonding portion in which openings of the respective accommodation recesses are covered by the cover tape in a state where the electronic components are not included in the respective accommodation recesses. A peel strength of the second bonding portion is about 10% or more and about 70% or less of a peel strength of the first bonding portion.

According to the electronic component array of a preferred embodiment of the present invention, the peel strength of the second bonding portion is about 10% or more and about 70% or less of the peel strength of the first bonding portion. Thus, the upper layer portion is less likely to be peeled off even when the cover tape is peeled off.

According to a method of manufacturing an electronic component array of a preferred embodiment of the present invention, the electronic component array includes a base tape including paper and having an elongated and substantially planar shape, the base tape being provided with a plurality of accommodation recesses provided in a longitudinal direction of the base tape; a plurality of electronic components; and a cover tape. The method of manufacturing an electronic component array includes a first step of covering openings of the respective accommodation recesses by the cover tape in a state where the electronic components are included in the respective accommodation recesses; a second step of bonding the cover tape for covering in the first step to the base tape; a third step of covering openings of the respective accommodation recesses by the cover tape in a state where the electronic components are not included in the respective accommodation recesses; and a fourth step of bonding the cover tape for covering in the third step to the base tape. A peel strength in the fourth step is less than a peel strength in the second step.

According to the method of manufacturing an electronic component array of a preferred embodiment of the present invention, the peel strength in the fourth step is less than the peel strength in the second step, thus allowing manufacturing of an electronic component array, in which the upper layer portion is less likely to be peeled off even when the cover tape is peeled off.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
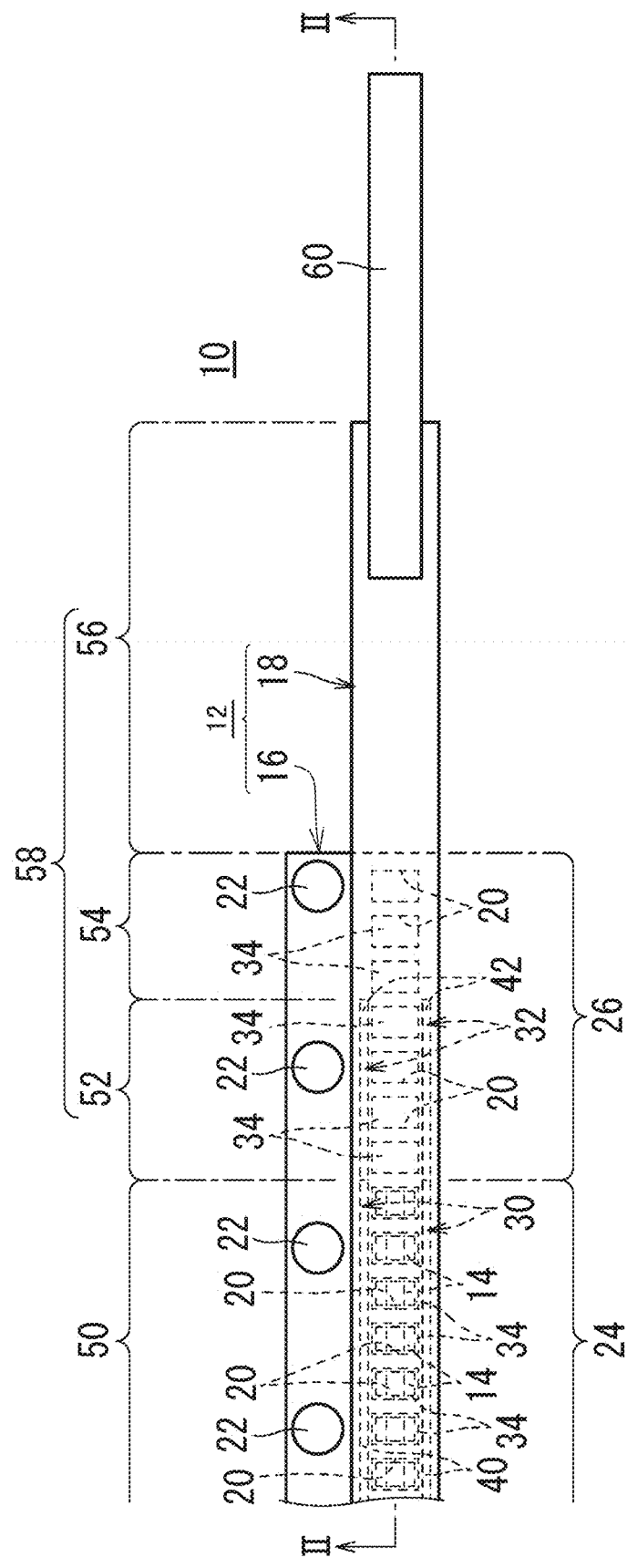
FIG. 1 is a plan view showing an electronic component array according to a first preferred embodiment of the present invention.
Figure 2:
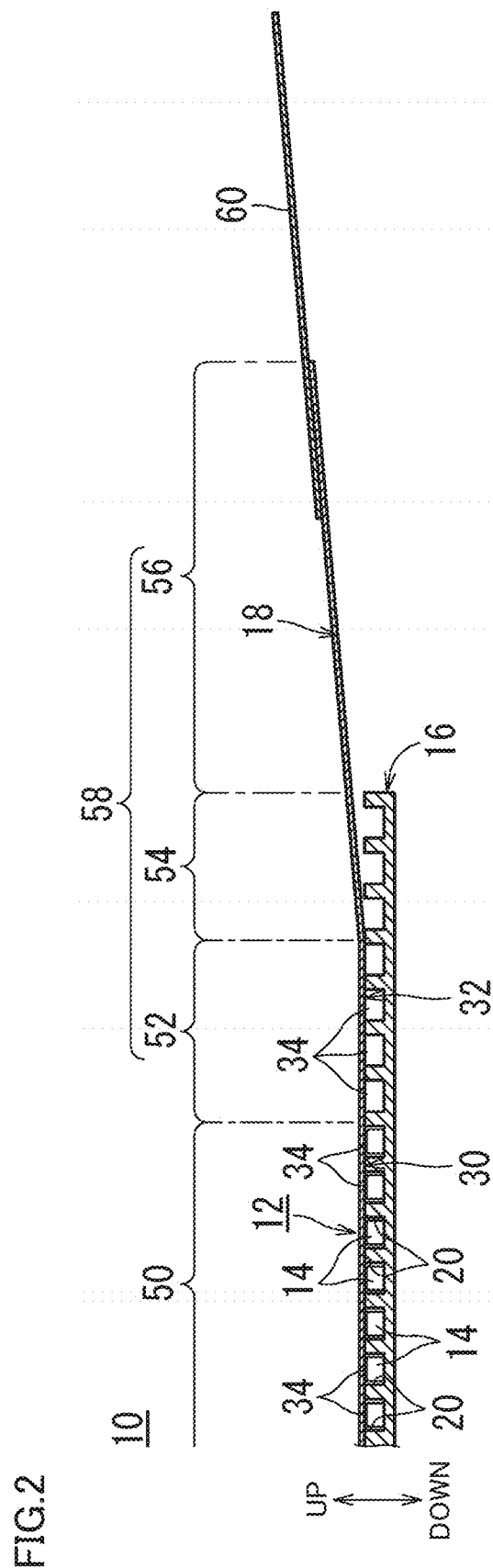
FIG. 2 is a cross-sectional view of the electronic component array shown in FIG. 1, which is taken along a line II-II.
Figure 3A:
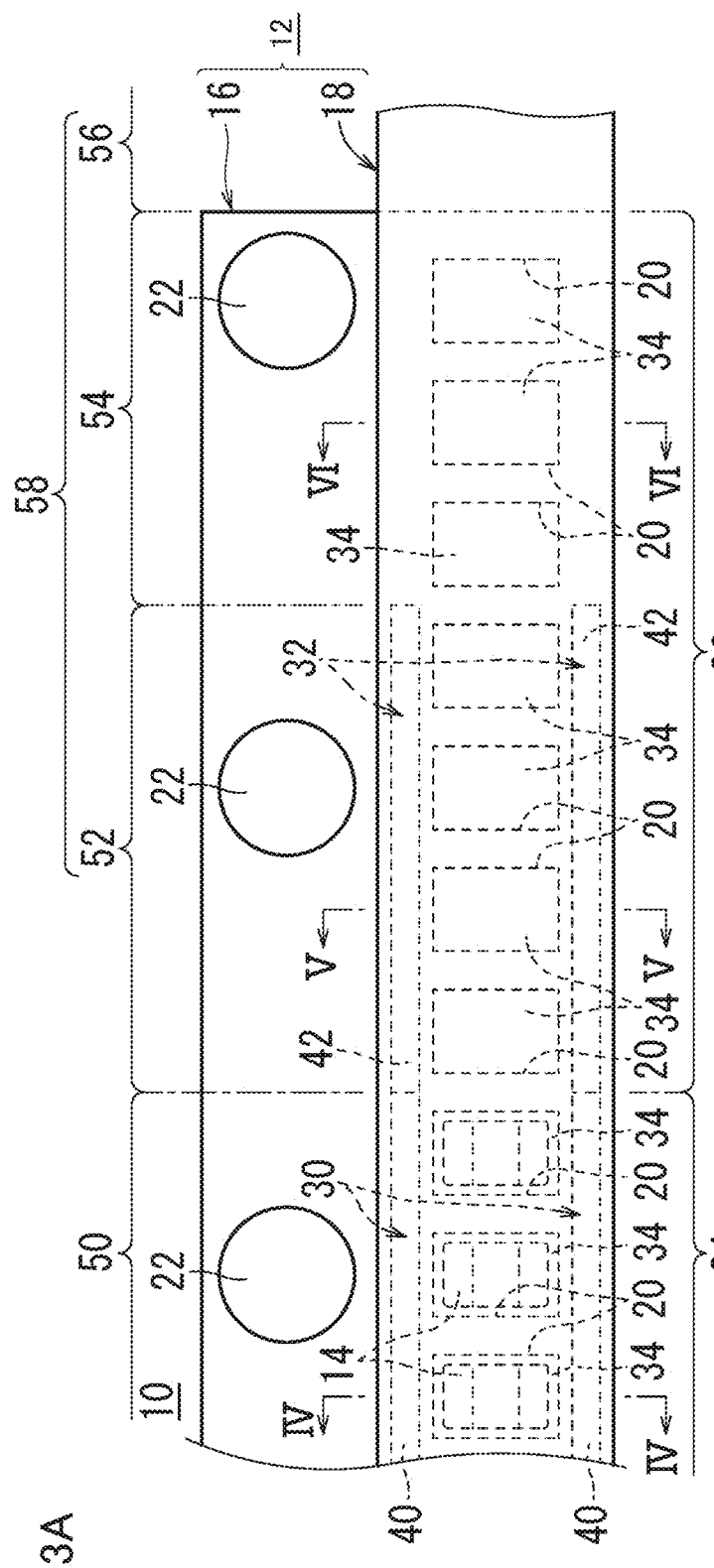
FIG. 3A is a plan view showing a portion of the electronic component array according to the first preferred embodiment of the present invention.
Figure 3B:
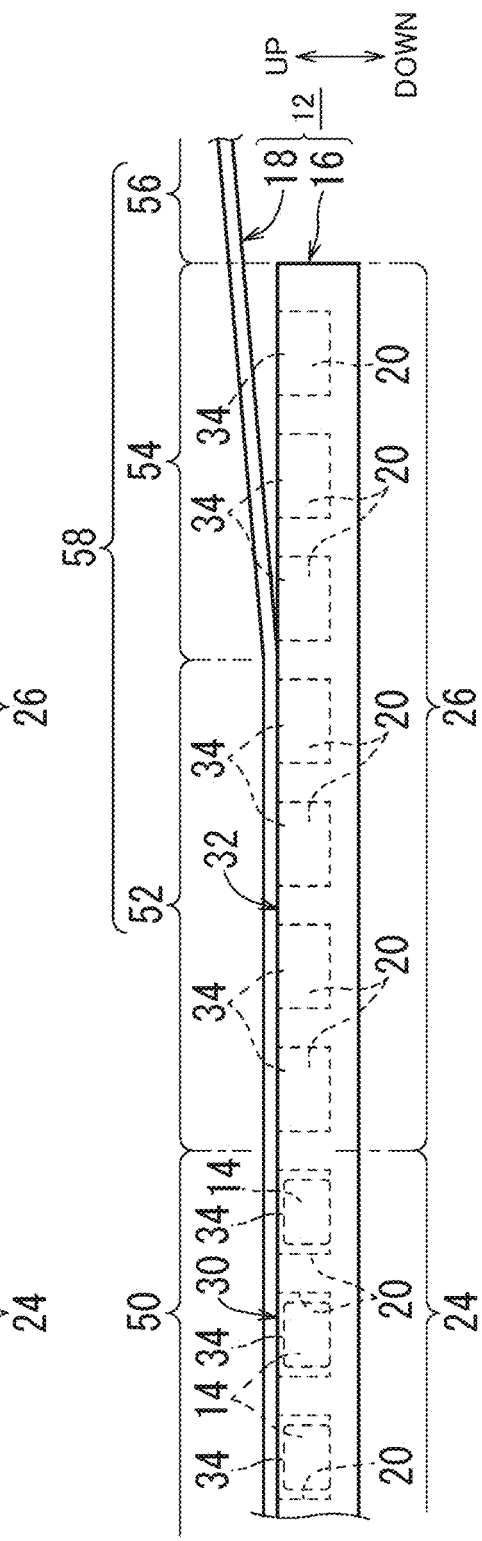
FIG. 3B is a perspective side view of the portion shown in FIG. 3A.
Figure 4:
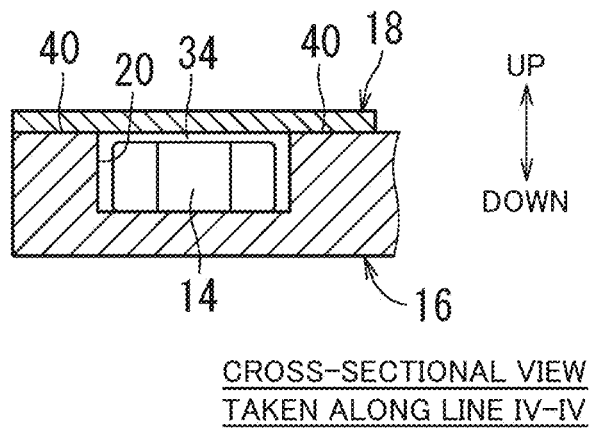
FIG. 4 is a cross-sectional view of the electronic component array shown in FIG. 3A, which is taken along a line IV-IV.
Figure 5:
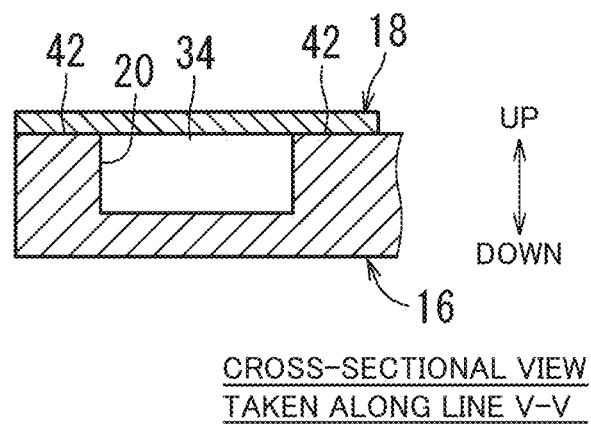
FIG. 5 is a cross-sectional view of the electronic component array shown in FIG. 3A, which is taken along a line V-V.
Figure 6:
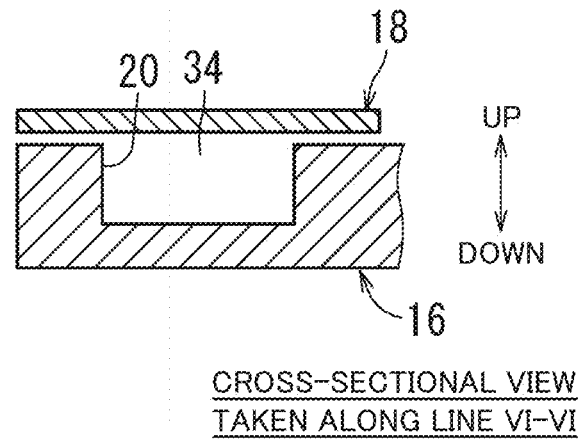
FIG. 6 is a cross-sectional view of the electronic component array shown in FIG. 3A, which is taken along a line VI-VI.

FIG. 1 is a plan view showing an electronic component array according to a first preferred embodiment of the present invention. FIG. 2 is a cross-sectional view of the electronic component array shown in FIG. 1, which is taken along a line II-II. FIG. 3A is a plan view showing a portion of the electronic component array according to the first preferred embodiment. FIG. 3B is a perspective side view of the portion shown in FIG. 3A. FIG. 4 is a cross-sectional view of the electronic component array shown in FIG. 3A, which is taken along a line IV-IV. FIG. 5 is a cross-sectional view of the electronic component array shown in FIG. 3A, which is taken along a line V-V. FIG. 6 is a cross-sectional view of the electronic component array shown in FIG. 3A, which is taken along a line VI-VI.

An electronic component array 10 according to the first preferred embodiment includes an electronic component package 12 and electronic components 14, as shown in FIGS. 1 and 2.

The electronic component array 10 is wound around a reel (not shown). The following is an explanation of a leading end portion of electronic component array 10 wound around the reel (hereinafter also referred to as a leading end portion of the electronic component array). The leading end portion is located on the outermost circumferential side of the reel.

Electronic component package 12 includes a base tape 16 in which electronic components 14 are provided; and a cover tape 18 that is bonded to at least most of the upper surface of base tape 16.

Accordingly, the direction in which elongated base tape 16 extends lengthwise will be referred to as a length direction while the short-side direction of base tape 16 will be referred to as a width direction. Also, the direction orthogonal or substantially orthogonal to the length direction and the width direction will be referred to as an up-down direction.

Base tape 16 has a multilayer structure including three or more layers including a surface layer, a back surface layer, and an intermediate layer that is located between the surface layer and the back surface layer. Each layer is a multilayer paperboard including wood pulp as a main material. Also, as a blending ratio (N/L material ratio) between hardwood pulp (an L material) and softwood pulp (an N material), the blending ratio of the N material is preferably about 10% or more and about 20% or less, but may be about 10% or less, for example.

Base tape 16 has an elongated and substantially planar shape. Inside this base tape 16, a plurality of accommodation recesses 20 are provided, each of which has a cross section having a substantially recessed shape. Accommodation recesses 20 are provided in line at a predetermined distance from each other in the length direction of base tape 16. Accommodation recesses 20 are provided in line adjacent to or in a vicinity of one side of base tape 16 in the width direction. Each of accommodation recesses 20 includes an inner space having a rectangular or substantially rectangular parallelepiped shape. Each of accommodation recesses 20 has a rectangular or substantially rectangular shape in plan view and is provided with an opening 34.

Base tape 16 is provided with feed holes 22 that are provided in line at a predetermined distance from each other in the length direction of base tape 16. Feed holes 22 are located in line adjacent to or in a vicinity of the other side of base tape 16 in the width direction. Feed holes 22 engage with respective teeth of a sprocket that pulls electronic component array 10 out of the reel.

Accommodation recesses 20 provided at the leading end portion of electronic component array 10 define a component containing portion 24 in which electronic components are provided, and a component non-containing portion 26 in which electronic components are not provided.

Cover tape 18 is affixed onto one surface of the base tape to cover openings 34 of respective accommodation recesses 20 provided in base tape 16. Cover tape 18 has an elongated and substantially planar shape and has a thin thickness. Cover tape 18 is provided adjacent to or in a vicinity of one side of base tape 16 in the width direction not to cover feed holes 22.

As shown in FIG. 1, a first bonding portion 30 is provided in base tape 16 in its length direction on each of both outer sides of openings 34 of respective accommodation recesses 20 in the width direction, which define component containing portion 24. First bonding portion 30 is bonded by a heat treatment in the state where openings 34 of respective accommodation recesses 20 that define component containing portion 24 are covered by cover tape 18. In other words, openings 34 of respective accommodation recesses 20 that define component containing portion 24 of base tape 16 are bonded to cover tape 18 by first bonding portion 30.

Furthermore, a second bonding portion 32 is provided in base tape 16 in its length direction on each of both outer sides of openings 34 of respective accommodation recesses 20 in the width direction, which define component non-containing portion 26. Second bonding portion 32 is bonded by a heat treatment in the state where openings 34 of respective accommodation recesses 20 that define component non-containing portion 26 are covered by cover tape 18 to the intermediate portion in the length direction. In other words, some of openings 34 of respective accommodation recesses 20 that define component non-containing portion 26 of base tape 16 are bonded to cover tape 18 by second bonding portion 32.

Furthermore, the length of second bonding portion 32 in the length direction is defined as 100 mm or more under JIS C0806-3: 2014, but is more preferably about 120 mm or more, for example. Thereby, peeling-off of the upper layer portion of base tape 16 is able to be further significantly reduced or prevented when cover tape 18 is manually peeled off from base tape 16.

When base tape 16 and cover tape 18 are bonded to each other in first bonding portion 30, a first bonding surface 40 having a substantially rectangular shape in plan view is formed at the boundary surface between base tape 16 and cover tape 18. First bonding surface 40 is located substantially in parallel with the length direction adjacent to or in a vicinity of openings 34 of respective accommodation recesses 20 that define component containing portion 24.

When base tape 16 and cover tape 18 are bonded to each other in second bonding portion 32, a second bonding surface 42 having a substantially rectangular shape in plan view is formed at the boundary surface between base tape 16 and cover tape 18. Second bonding surface 42 is located substantially in parallel with the length direction adjacent to or in a vicinity of openings 34 of respective accommodation recesses 20 that define component non-containing portion 26.

The bonding force between base tape 16 and cover tape 18 in first bonding portion 30 is represented by a peel strength $F_1$. Peel strength $F_1$ of first bonding portion 30 preferably has a bonding force of about 0.2 N or more and about 0.5 N or less, for example.

The bonding force between base tape 16 and cover tape 18 in second bonding portion 32 is represented by a peel strength $F_2$. Peel strength $F_2$ of second bonding portion 32 is preferably about 0.02 N or more and about 0.35 N or less, for example. Peel strength $F_2$ of second bonding portion 32 is less than peel strength $F_1$ of first bonding portion 30. Furthermore, peel strength $F_2$ of second bonding portion 32 is about 10% or more and about 70% or less of peel strength $F_1$ of first bonding portion 30. Preferably, for example, peel strength $F_2$ of second bonding portion 32 is about 10% or more and about 50% or less of peel strength $F_1$ of first bonding portion 30. By setting peel strength $F_2$ of second bonding portion 32 in the range described above, peeling-off of the upper layer portion of base tape 16 is able to be further significantly reduced or prevented when cover tape 18 is manually peeled off from base tape 16.

Furthermore, as shown in FIGS. 1 to 3B, the leading end portion of electronic component array 10 includes a first seal portion 50, and a leader portion 58 that includes a second seal portion 52, a non-seal portion 54, and a cover tape portion 56. Furthermore, cover tape portion 56 includes a leading end portion to which an end tape 60 having an elongated shape is affixed.

First seal portion 50 in electronic component array 10 is provided as a portion in which, as shown in FIG. 4, electronic components 14 are provided in respective accommodation recesses 20 that define component containing portion 24 of base tape 16, and cover tape 18 is bonded to base tape 16 by first bonding portion 30.

Second seal portion 52 in electronic component array 10 is provided as a portion in which, as shown in FIG. 5, electronic components 14 are not provided in respective accommodation recesses 20 that define component non-containing portion 26 of base tape 16, and cover tape 18 is bonded to base tape 16 by second bonding portion 32.

Non-seal portion 54 in electronic component array 10 is provided as a portion in which, as shown in FIG. 6, electronic components 14 are not provided in respective accommodation recesses 20 that define component non-containing portion 26 of base tape 16, and cover tapes 18 is not bonded to base tape 16.

Cover tape portion 56 in electronic component array 10 is provided as a portion not covering base tape 16 and protrude in the length direction from the leading end portion of base tape 16 toward the outside of base tape 16.

Also, the leading end portion of electronic component array 10 includes first seal portion 50, second seal portion 52, non-seal portion 54, and cover tape portion 56 that are provided in this order toward the leading end thereof.

When the reel around which electronic component array 10 is wound is mounted in a mounting machine, cover tape 18 is peeled off to avoid peeling off the upper layer portion of base tape 16.

According to electronic component array 10 in the first preferred embodiment, assuming that the bonding force between base tape 16 and cover tape 18 in first bonding portion 30 is defined as peel strength $F_1$, and that the bonding force between base tape 16 and cover tape 18 in second bonding portion 32 is defined as peel strength $F_2$, peel strength $F_2$ of second bonding portion 32 is less than peel strength $F_1$ of first bonding portion 30. Thereby, peeling-off of the upper layer portion of base tape 16 is able to be significantly reduced or prevented when cover tape 18 is manually peeled off from base tape 16.

An electronic component array according to a second preferred embodiment of the present invention will be described below.

An electronic component array 110 according to the second preferred embodiment has the same or similar features as electronic component array 10 except that a first bonding portion 130 and a second bonding portion 132 are different from first bonding portion 30 and second bonding portion 32, respectively, in electronic component array 10 in the first preferred embodiment. Accordingly, the same or similar portions as electronic component array 10 will be denoted by the same reference characters, and the description thereof will not be repeated.

Figure 7:
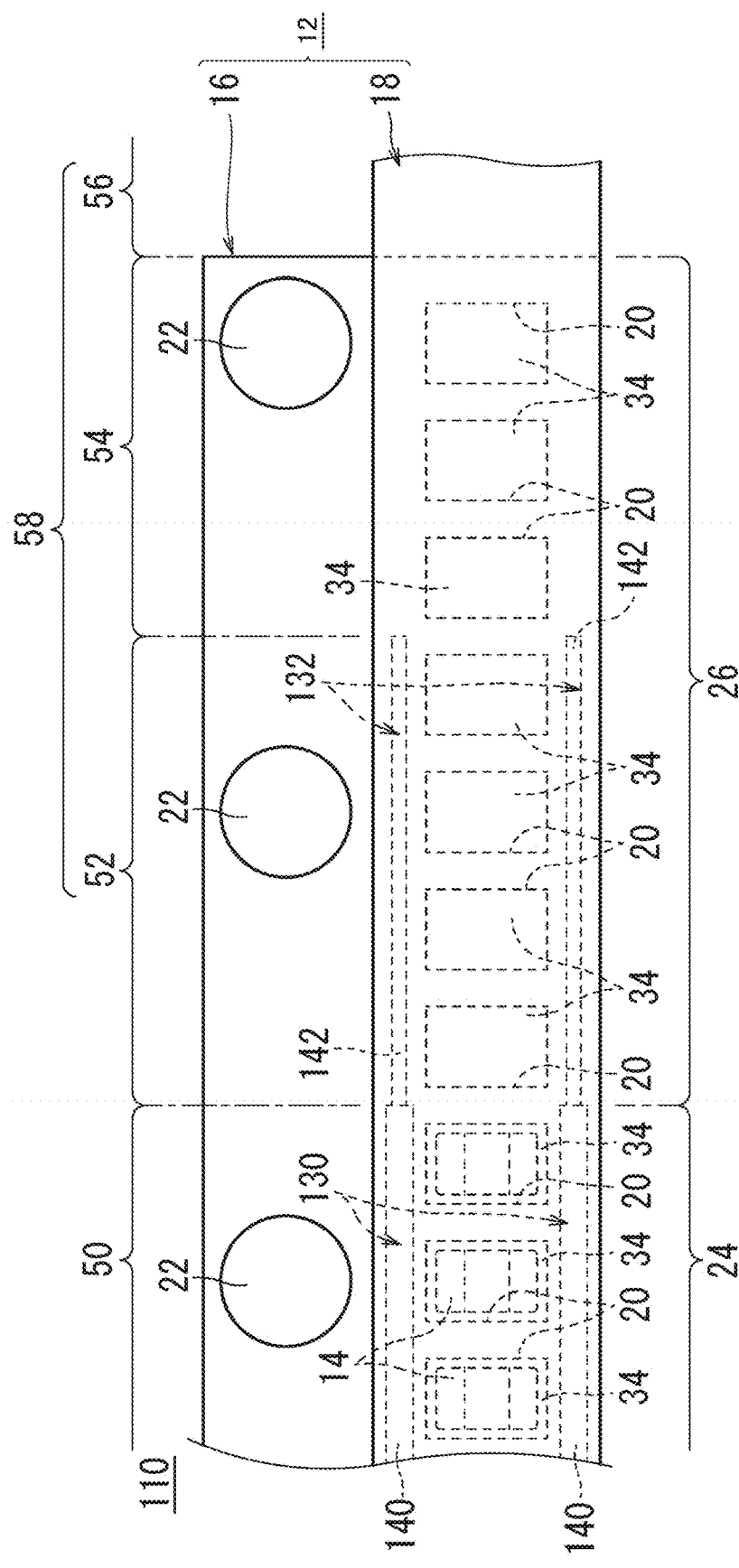
FIG. 7 is a plan view showing an electronic component array according to a second preferred embodiment of the present invention.

FIG. 7 is a plan view showing an electronic component array according to the second preferred embodiment.

Electronic component array 110 includes an electronic component package 12 and electronic components 14.

Electronic component package 12 includes a base tape 16 in which electronic components 14 are provided, and a cover tape 18 that is bonded to at least most of the upper surface of base tape 16.

As shown in FIG. 7, a first bonding portion 130 is provided in base tape 16 in its length direction on each of both outer sides of openings 34 of respective accommodation recesses 20 in the width direction, which define a component containing portion 24. First bonding portion 30 is bonded by a heat treatment in the state where openings 34 of respective accommodation recesses 20 that define component containing portion 24 are covered by cover tape 18. In other words, openings 34 of respective accommodation recesses 20 that define component containing portion 24 of base tape 16 are bonded to cover tape 18 by first bonding portion 130.

Furthermore, a second bonding portion 132 is provided in base tape 16 in its length direction on each of both outer sides of openings 34 of respective accommodation recesses 20 in the width direction, which define a component non-containing portion 26. Second bonding portion 132 is bonded by a heat treatment in the state where openings 34 of respective accommodation recesses 20 that define component non-containing portion 26 are covered by cover tape 18 to the intermediate portion in the length direction. In other words, some of openings 34 of respective accommodation recesses 20 that define component non-containing portion 26 of base tape 16 are bonded to cover tape 18 by second bonding portion 132.

When base tape 16 and cover tape 18 are bonded to each other in first bonding portion 130, a first bonding surface 140 having a rectangular or substantially rectangular shape in plan view is formed at the boundary surface between base tape 16 and cover tape 18. First bonding surface 140 is located in parallel or substantially in parallel with the length direction adjacent to or in a vicinity of openings 34 of respective accommodation recesses 20 that define component containing portion 24.

When base tape 16 and cover tape 18 are bonded to each other in second bonding portion 132, a second bonding surface 142 having a rectangular or substantially rectangular shape in plan view is provided at the boundary surface between base tape 16 and cover tape 18. Second bonding surface 142 is located in parallel or substantially in parallel with the length direction adjacent to or in a vicinity of openings 34 of respective accommodation recesses 20 that define component non-containing portion 26.

Furthermore, first bonding surface 140 is larger in dimension in the width direction than second bonding surface 142.

In other words, the area per unit length of first bonding surface 140 of first bonding portion 130 is greater than the area per unit length of second bonding surface 142 of second bonding portion 132. Thus, peel strength $F_1$ corresponding to the bonding force between base tape 16 and cover tape 18 in first bonding portion 130 is able to be set to be higher than peel strength $F_2$ corresponding to the bonding force between base tape 16 and cover tape 18 in second bonding portion 132.

Specifically, peel strength $F_2$ of second bonding portion 132 is about 10% or more and about 70% or less of peel strength $F_1$ of first bonding portion 130. Preferably, for example, peel strength $F_2$ of second bonding portion 132 is about 10% or more and about 50% or less of first peel strength $F_1$ of first bonding portion 130.

In addition, peel strength $F_1$ of first bonding portion 130 preferably has a bonding force of about 0.2 N or more and about 0.5 N or less, for example.

Furthermore, peel strength $F_2$ of second bonding portion 132 is preferably about 0.02 N or more and about 0.35 N or less, for example.

Electronic component array 110 according to the second preferred embodiment provides the same or similar advantageous effects as electronic component array 10 according to the first preferred embodiment and also provides the following advantageous effects.

Specifically, in electronic component array 110 according to the second preferred embodiment, the area per unit length of second bonding surface 142 in second bonding portion 132 is smaller than the area per unit length of first bonding surface 140 in first bonding portion 132. Accordingly, peel strength $F_1$ corresponding to the bonding force between base tape 16 and cover tape 18 in first bonding portion 130 is able to be set to be higher than peel strength $F_2$ corresponding to the bonding force between base tape 16 and cover tape 18 in second bonding portion 132. Thereby, peeling-off of the upper layer portion of base tape 16 is able to be significantly reduced or prevented when cover tape 18 is manually peeled off from base tape 16.

A preferred embodiment of a method of manufacturing the electronic component array as described above will be described.

Figure 8:
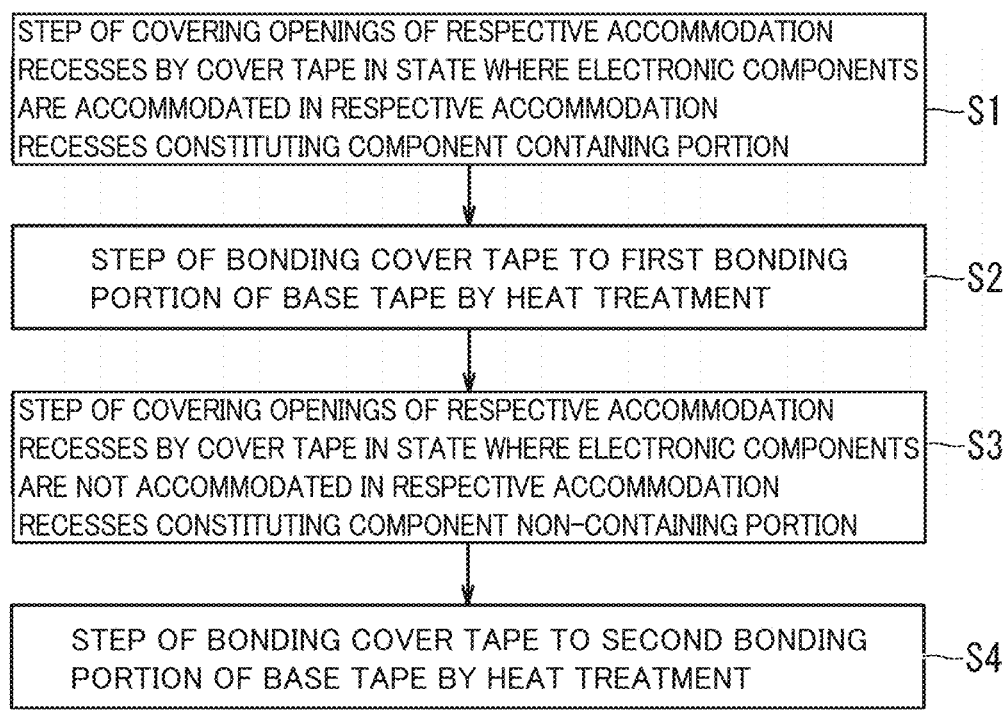
FIG. 8 is a flowchart showing steps of a method of manufacturing the electronic component array according to the first preferred embodiment of the present invention.
Figure 9:
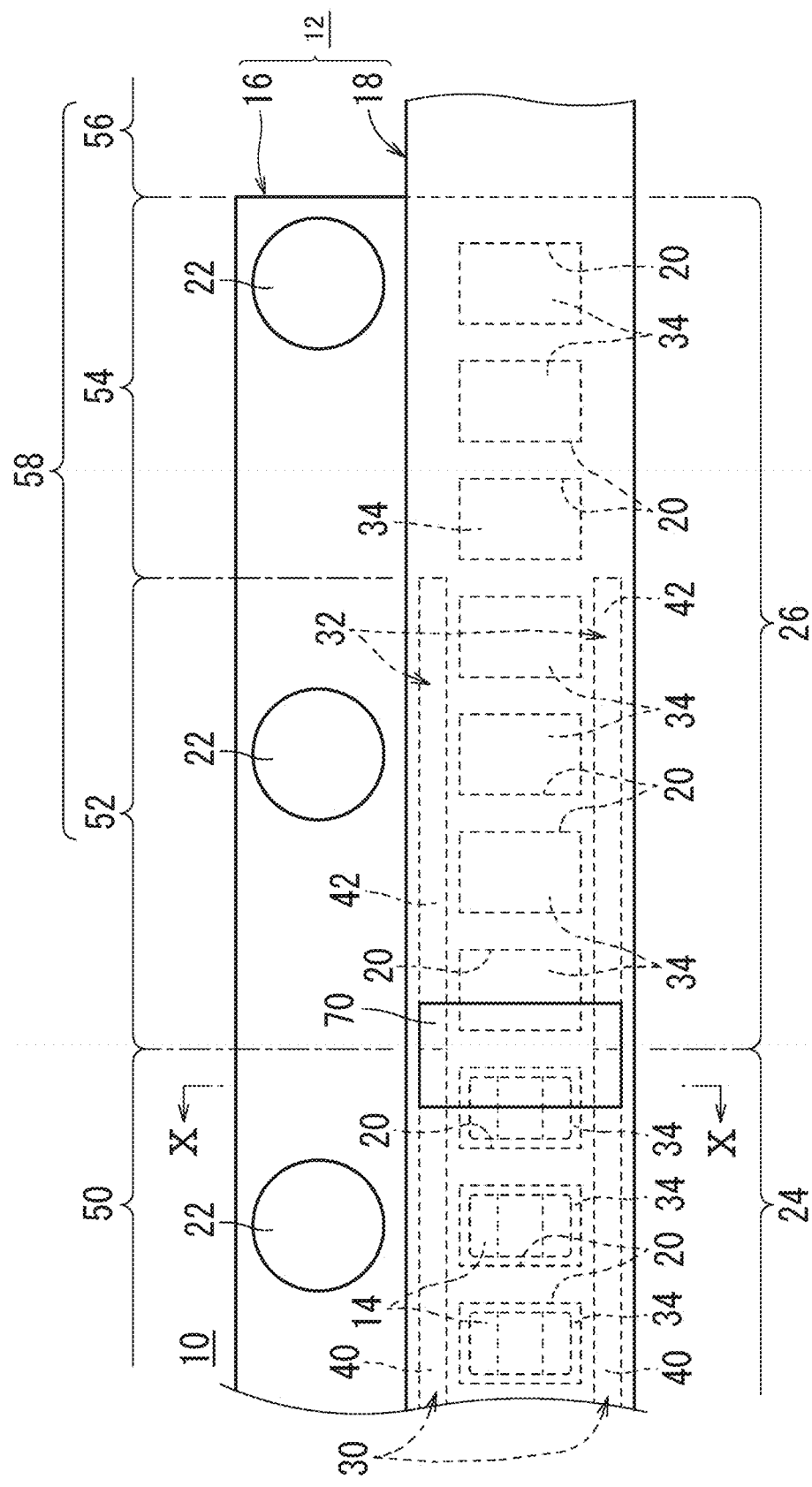
FIG. 9 is a plan view showing the state where a trowel is pressed against a cover sheet in a step of manufacturing the electronic component array according to the first preferred embodiment of the present invention.
Figure 10:
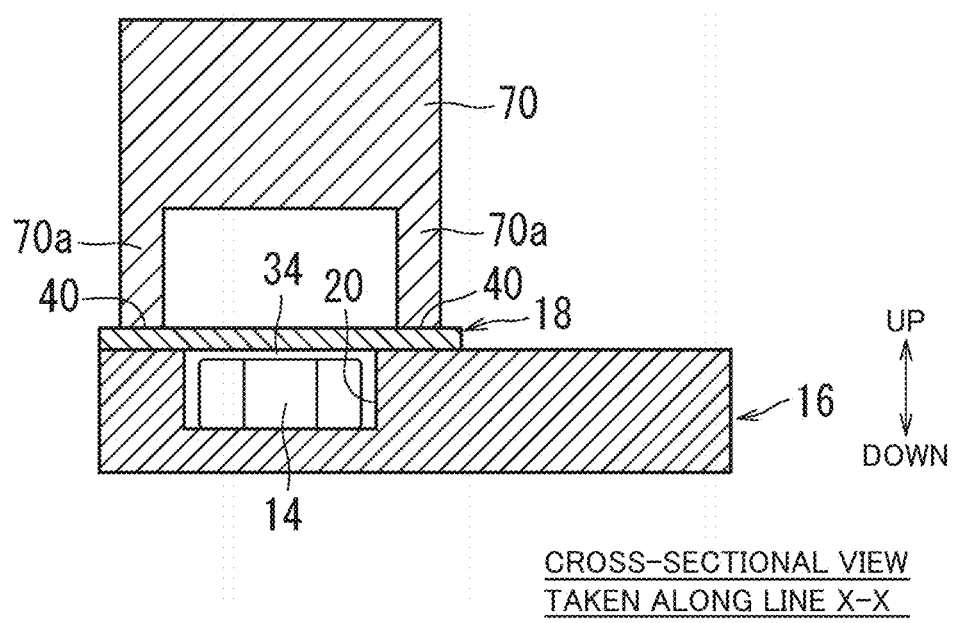
FIG. 10 is a cross-sectional view showing the state where the trowel is pressed against the cover sheet in a step of manufacturing the electronic component array shown in FIG. 9, which is taken along a line X-X.

FIG. 8 is a flowchart showing steps of a method of manufacturing the electronic component array according to the first preferred embodiment. FIG. 9 is a plan view showing the state where a trowel is pressed against a cover sheet in a step of manufacturing the electronic component array according to the first preferred embodiment. FIG. 10 is a cross-sectional view showing the state where the trowel is pressed against the cover sheet in a step of manufacturing the electronic component array shown in FIG. 9, which is taken along a line X-X. FIGS. 11A to 11D are explanatory diagrams showing steps of the method of manufacturing the electronic component array according to the first preferred embodiment.

Figure 11A:
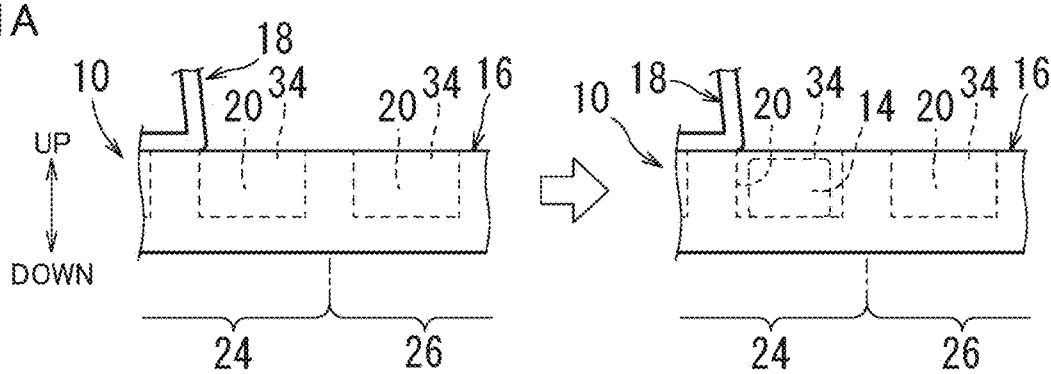
FIGS. 11A to 11D are explanatory diagrams showing steps of the method of manufacturing the electronic component array according to the first preferred embodiment of the present invention.

First, in a first step S1, openings 34 of respective accommodation recesses 20 are covered by cover tape 18 in the state where electronic components 14 are provided in respective accommodation recesses 20 defining component containing portion 24, as shown in FIG. 11A.

Figure 11B:
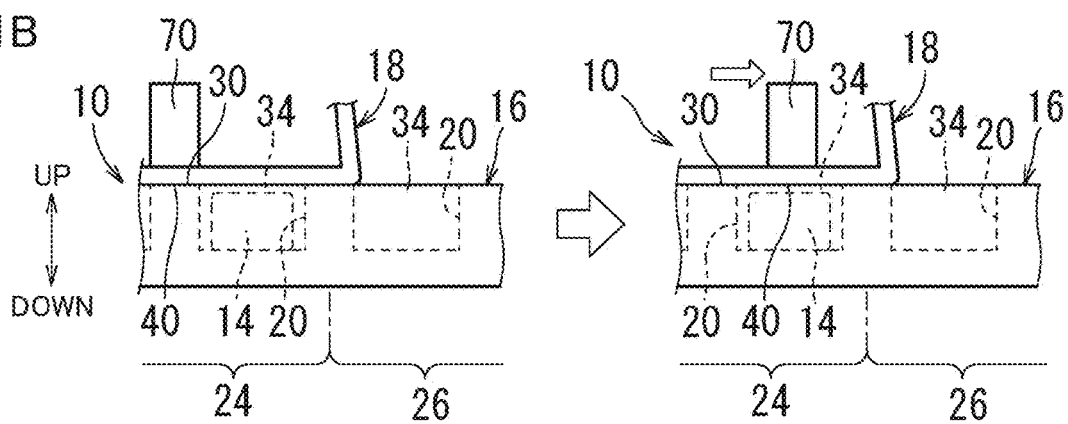

Then, in a second step S2, cover tape 18 for covering in first step S1 is bonded to first bonding portion 30 of base tape 16 by a trowel 70, as shown in FIG. 11B. Trowel 70 is heated by a heater to a predetermined temperature. Trowel 70 includes a pair of pressing portions 70a that each have a width less than any of widths of portions of the upper surface of base tape 16 in its width direction that exclude accommodation recesses 20 and feed holes 22. Pressing portions 70a press cover tape 18 from above, and cover tape 18 is thermocompression-bonded onto base tape 16. This thermocompression bonding by trowel 70 is repeatedly performed according to the moving pitch of base tape 16, and thus, bonding between base tape 16 and cover tape 18 is continuously performed. Accordingly, peel strength $F_1$ corresponding to the bonding force between base tape 16 and cover tape 18 in first bonding portion 30 is adjusted to provide a bonding force of about 0.2 N or more and about 0.5 N or less, for example.

Figure 11C:
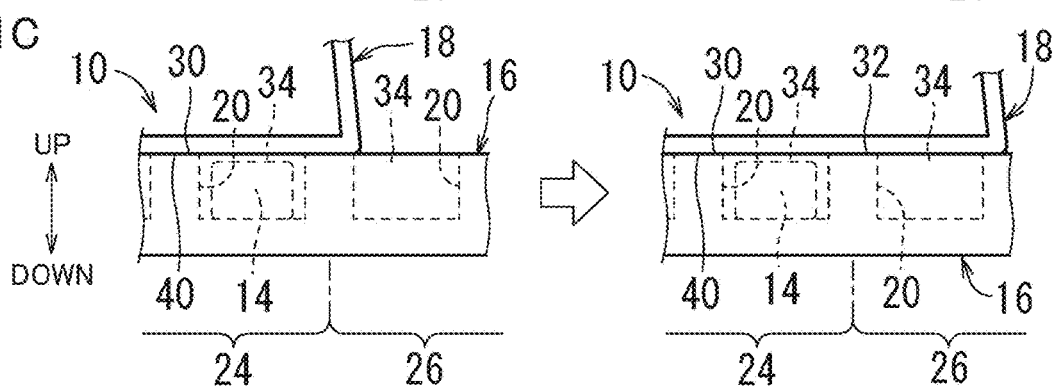

Then, in a third step S3, openings 34 of respective accommodation recesses 20 defining component non-containing portion 26 are covered by cover tape 18, as shown in FIG. 11C.

Figure 11D:
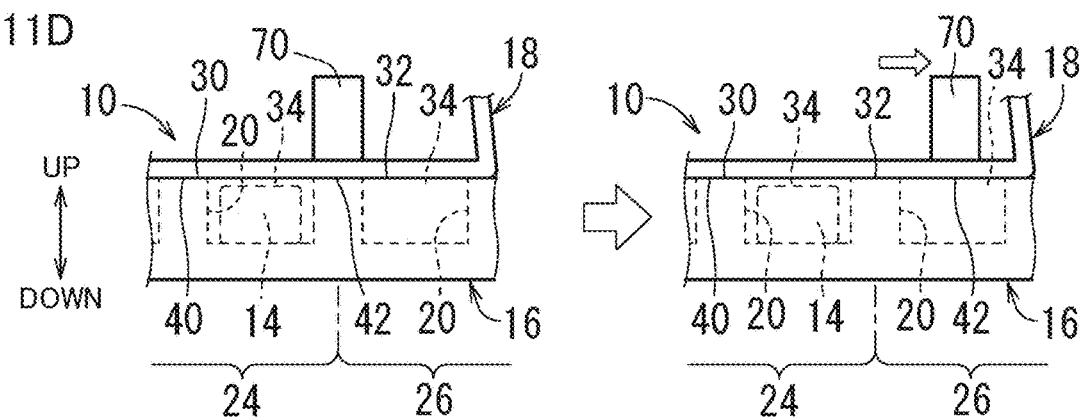

Then, in a fourth step S4, cover tape 18 for covering in third step S3 is bonded to second bonding portion 32 of base tape 16 by trowel 70, as shown in FIG. 11D. The bonding method is the same as or similar to the bonding method applied in second step S2. Accordingly, peel strength $F_2$ corresponding to the bonding force between base tape 16 and cover tape 18 in second bonding portion 32 is about 0.02 N or more and about 0.35 N or less, for example. Furthermore, peel strength $F_2$ of second bonding portion is less than peel strength $F_1$ of first bonding portion 30. Furthermore, peel strength $F_2$ of second bonding portion 32 is about 10% or more and about 70% or less of peel strength $F_1$ of first bonding portion 30. Preferably, for example, peel strength $F_2$ of second bonding portion 32 is about 10% or more and about 50% or less of peel strength $F_1$ of first bonding portion 30.

As described above, the trowel is controlled as described below to bond with peel strength $F_1$ by first bonding portion 30 and to bond with peel strength $F_2$ by second bonding portion 32.

In other words, assuming that a heat treatment time period taken by trowel 70 in second step S2 is defined as $t_1$ and that a heat treatment time period taken by trowel 70 in fourth step S4 is defined as $t_2$, heat treatment time period $t_1$ in second step S2 is set at:

$$1 \ (ms) \leq t_1 \leq 5 \ (ms), \text{ and}$$

heat treatment time period $t_2$ in fourth step S4 is set at:

$$0.1 \times t_1 \leq t_2 \leq 0.7 \times t_1.$$

Accordingly, trowel 70 used in second step S2 may be different from trowel 70 used in fourth step S4.

Furthermore, the trowel may be controlled as described below to bond with peel strength $F_1$ by first bonding portion 30 and to bond with peel strength $F_2$ by second bonding portion 32.

Specifically, assuming that the pressing force in second step S2 is defined as $PF_1$ and the pressing force in fourth step S4 is defined as $PF_2$, pressing force $PF_1$ in second step S2 is set at:

$$20 \ (N) \leq PF_1 \leq 40 \ (N), \text{ and}$$

pressing force $PF_2$ in fourth step S4 is set at:

$$0.1 \times PF_1 \leq PF_2 \leq 0.7 \times PF_1.$$

Accordingly, trowel 70 used in second step S2 may be different from trowel 70 used in fourth step S4.

Furthermore, the trowel may be controlled as described below to bond with peel strength $F_1$ by first bonding portion 30 and to bond with peel strength $F_2$ by second bonding portion 32.

Specifically, assuming that the heat treatment temperature in second step S2 is defined as $T_1$ and the heat treatment temperature in fourth step S4 is defined as $T_2$, heat treatment temperature $T_1$ in second step S2 is set at:

$$160 \ (° \ C.) \leq T_1 \leq 230 \ (° \ C.), \text{ and}$$

heat treatment temperature $T_2$ in fourth step S4 is set at:

$$T_1 \geq T_2.$$

Furthermore, heat treatment temperature $T_2$ is preferably set to be lower than heat treatment temperature $T_1$ by a range of about 20° C. or more and about 30° C. or less, for example.

Accordingly, trowel 70 used in second step S2 is preferably different from trowel 70 used in fourth step S4, for example. For example, two types of trowels are prepared, including trowel 70 for second step S2 that is set at heat treatment temperature $T_1$ and trowel 70 for fourth step S4 that is set at heat treatment temperature $T_2$.

In second step S2, first seal portion 50 of cover tape 18 for covering in first step S1 may be bonded to first bonding portion 30 of base tape 16 not only by a heat treatment but also by pressure-sensitive bonding that is not a heat treatment.

In fourth step S4, second seal portion 52 of cover tape 18 for covering in third step S3 may be bonded to second bonding portion 32 of base tape 16 not only by a heat treatment but also by pressure-sensitive bonding that is not a heat treatment.

According to the method of manufacturing electronic component array 10 in the first preferred embodiment, first step S1 to fourth step S4 are performed, and peel strength $F_2$ of second bonding portion 32 is set to be less than peel strength $F_1$ of first bonding portion 30. Thereby, electronic component array 10 is able to be manufactured, in which peeling-off of the upper layer portion of base tape 16 is able to be significantly reduced or prevented when cover tape 18 is manually peeled off from base tape 16.

The following is an explanation of a non-limiting example of a method of manufacturing an electronic component array according to the second preferred embodiment of the present invention.

The method of manufacturing the electronic component array according to the second preferred embodiment is to manufacture electronic component array 110, and includes the same or similar steps as the method of manufacturing the electronic component array according to the first preferred embodiment except that different trowels are used in second step S2 and fourth step S4. Accordingly, the same or similar steps as the method of manufacturing the electronic component array according to the first preferred embodiment will not be described.

Figure 12:
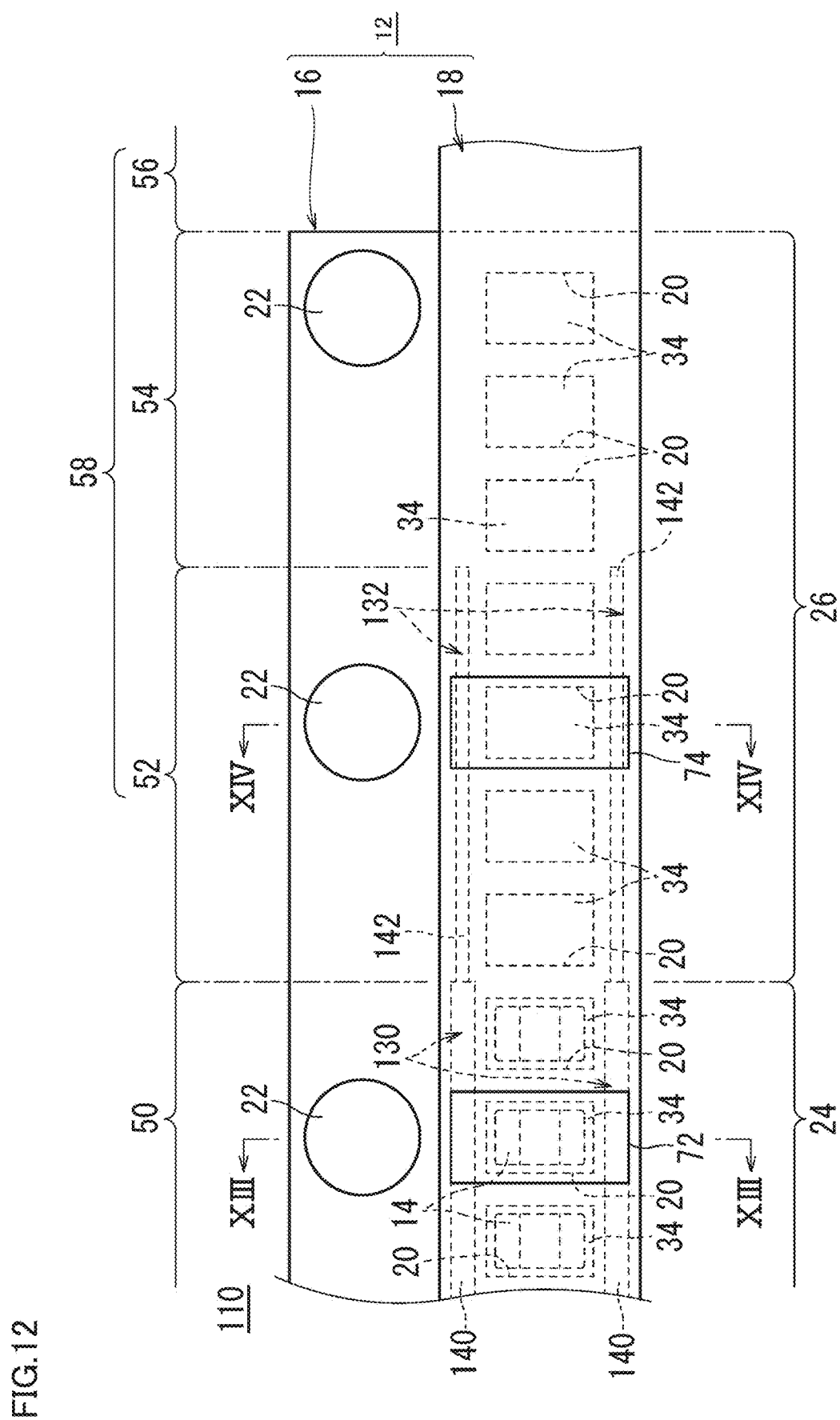
FIG. 12 is a plan view showing the state where a first trowel and a second trowel are pressed against a cover sheet in a step of manufacturing an electronic component array according to the second preferred embodiment of the present invention.
Figure 13:
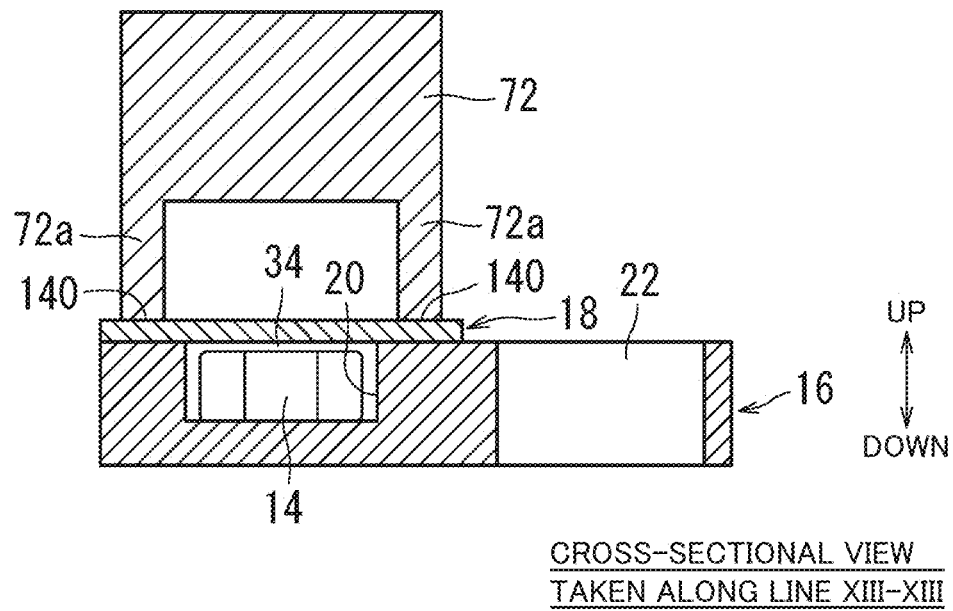
FIG. 13 is a cross-sectional view showing the state where the first trowel is pressed against the cover sheet in a step of manufacturing the electronic component array shown in FIG. 12, which is taken along a line XIII-XIII.
Figure 14:
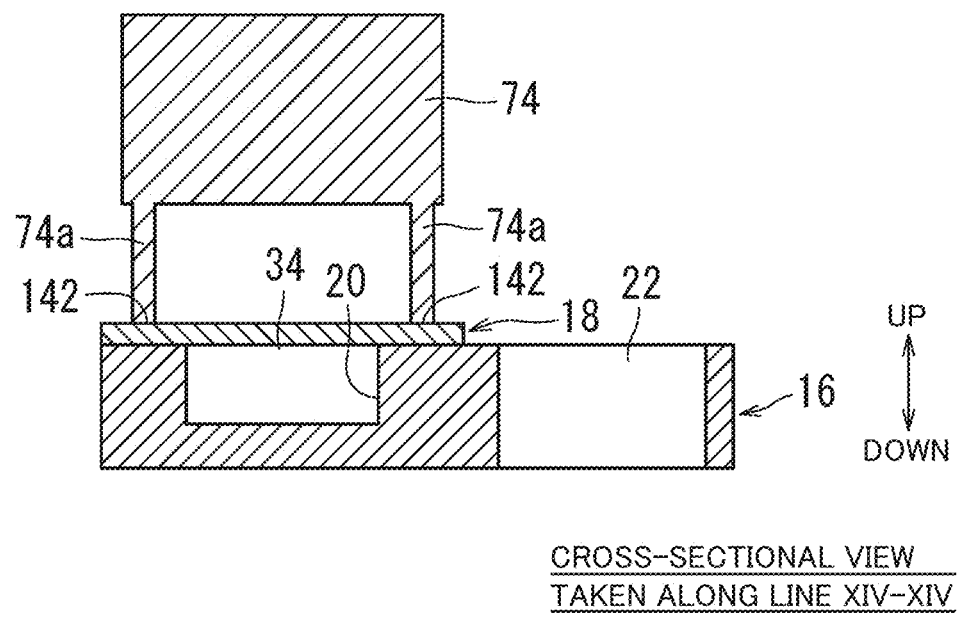
FIG. 14 is a cross-sectional view showing the state where the second trowel is pressed against the cover sheet in a step of manufacturing the electronic component array shown in FIG. 12, which is taken along a line XIV-XIV.

FIG. 12 is a plan view showing the state where a first trowel and a second trowel are pressed against a cover sheet in a step of manufacturing an electronic component array according to the second preferred embodiment. FIG. 13 is a cross-sectional view showing the state where the first trowel is pressed against the cover sheet in a step of manufacturing the electronic component array shown in FIG. 12, which is taken along a line XIII-XIII. FIG. 14 is a cross-sectional view showing the state where the second trowel is pressed against the cover sheet in a step of manufacturing the electronic component array shown in FIG. 12, which is taken along a line XIV-XIV.

First, in second step S2, cover tape 18 for covering in first step S1 is bonded to first bonding portion 130 of base tape by a first trowel 72. First trowel 72 is heated to a predetermined temperature by a heater. First trowel 72 includes a pair of pressing portions 72a and 72a each having a width less than any of widths of portions of the upper surface of base tape 16 in its width direction that exclude accommodation recesses 20 and feed holes 22. Pressing portions 72a and 72a press cover tape 18 from above, and cover tape 18 is thermocompression-bonded onto base tape 16. This thermocompression bonding by first trowel 72 is repeatedly performed according to the moving pitch of base tape 16, and thus, bonding between base tape 16 and cover tape 18 is continuously performed. Accordingly, peel strength $F_1$ corresponding to the bonding force between base tape 16 and cover tape 18 in first bonding portion 130 is adjusted to provide a bonding force of about 0.2 N or more and about 0.5 N or less, for example.

Furthermore, in fourth step S4, cover tape 18 for covering in third step S3 is bonded to second bonding portion 132 of base tape 16 by a second trowel 74. Second trowel 74 is heated to a predetermined temperature by a heater. Second trowel 74 has a pair of pressing portions 74a and 74a each having a width less than any of widths of portions of the upper surface of base tape 16 in its width direction that exclude accommodation recesses 20 and feed holes 22. Pressing portions 74a and 74a press cover tape 18 from above, and cover tape 18 is thermocompression-bonded onto base tape 16. This thermocompression bonding by second trowel 74 is repeatedly performed according to the moving pitch of base tape 16, and thus, bonding between base tape 16 and cover tape 18 is continuously performed. Pressing portions 74a and 74a of second trowel 74 are smaller in dimension in the width direction than pressing portions 72a and 72a, respectively, of first trowel 72. Thereby, the area per unit length of first bonding surface 140 in first bonding portion 130 is able to be larger than the area per unit length of second bonding surface 142 in second bonding portion 132. Accordingly, peel strength $F_2$ corresponding to the bonding force between base tape 16 and cover tape 18 in second bonding portion 132 is about 0.02 N or more and about 0.35 N or less, for example. Furthermore, peel strength $F_2$ of second bonding portion 132 is less than peel strength $F_1$ of first bonding portion 130. Furthermore, peel strength $F_2$ of second bonding portion 132 is about 10% or more and about 70% or less of peel strength $F_1$ of first bonding portion 130. Preferably, for example, peel strength $F_2$ of second bonding portion 132 is about 10% or more and about 50% or less of peel strength $F_1$ of first bonding portion 130.

The method of manufacturing the electronic component array according to the second preferred embodiment provides the same or a similar advantageous effects as the method of manufacturing the electronic component array according to the first preferred embodiment.

The following is an explanation of an experimental example conducted by the inventor of preferred embodiments of the present invention in order to check the advantageous effects of the preferred embodiments of the present invention. In the present experiment, electronic component array 10 according to the first preferred embodiment was examined to determine the advantageous effects of significantly reducing or preventing peeling-off of the upper layer portion in base tape 16 when cover tape 18 is peeled off from base tape 16. Accordingly, base tape 16 includes a multilayer paperboard including five to six layers. Furthermore, as a blending ratio (N/L material ratio) between hardwood pulp (an L material) and softwood pulp (an N material), the blending ratio of the N material was set to be about 10% or more and about 20% or less.

In Experimental Example 1, an experiment was conducted with samples each prepared to include first bonding portion 30 having fixed peel strength $F_1$ and second bonding portion 32 having peel strength $F_2$ that is variable. The specifications of each of Examples and Comparative Example are described below.

In the samples of the electronic component arrays prepared in Example 1, first bonding portions 30 each had a peel strength $F_1$ within a range of about 0.2 N or more and about 0.5 N or less, and the average value of peel strengths $F_1$ of first bonding portions 30 was about 0.35 N, and also, second bonding portions 32 each had a peel strength $F_2$ of $$0.1 \times F_1 \leq F_2 \leq 0.7 \times F_1.$$

Furthermore, the length of each of the second bonding portions in the length direction was about 100 mm.

In the samples of the electronic component arrays prepared in Example 2, first bonding portions 30 each had a peel strength $F_1$ within a range of about 0.2 N or more and about 0.5 N or less, and the average value of peel strengths $F_1$ of first bonding portions 30 was about 0.35 N, and also, second bonding portions 32 each had a peel strength $F_2$ of $$0.1 \times F_1 \leq F_2 \leq 0.5 \times F_1.$$

Furthermore, the length of each of the second bonding portions in the length direction was about 100 mm.

In the samples of the electronic component arrays prepared in Comparative Example, first bonding portions 30 each had a peel strength $F_1$ within a range of about 0.2 N or more and about 0.5 N or less, and the average value of peel strengths $F_1$ of first bonding portions 30 was about 0.35 N, and also, peel strength $F_2$ of each second bonding portion 32 was substantially the same as peel strength $F_1$ of each first bonding portion 30 ($F_1 = F_2$).

Furthermore, the length of each of the second bonding portions in the length direction was about 100 mm.

Assuming that the number of samples in each of Examples 1 and 2 and Comparative Example was set at 1000 reels, Experimental Example 1 was evaluated based on the number of failures (the number of reels) per 1000 reels.

Table 1 shown below represents the evaluation results about Examples 1 and 2 and Comparative Example.

TABLE 1

| | Number of Failures (Number of Pieces) per 1000 Reels |
|---|---|
| Comparative Example | 12 |
| Example 1 | 5 |
| Example 2 | 2 |

As shown in Table 1, in each of the samples of the electronic component arrays in Example 1, peel strength $F_2$ in second bonding portion 32 was less than peel strength $F_1$ in first bonding portion 30, and peel strength $F_2$ in second bonding portion 32 was $0.1 \times F_1 \leq F_2 \leq 0.7 \times F_1$. Consequently, the number of failures per 1000 reels was 5.

Furthermore, in each of the samples of the electronic component arrays in Example 2, peel strength $F_2$ in second bonding portion 32 was $0.1 \times F_1 \leq F_2 \leq 0.5 \times F_1$. Consequently, the number of failures per 1000 reels was 2.

On the other hand, in each of the samples of the electronic component arrays in Comparative Example, peel strength $F_2$ in second bonding portion 32 was substantially the same as peel strength $F_1$ in first bonding portion 30 ($F_1 = F_2$). Thus, the number of failures per 1000 reels was 12, which was relatively greater in number of failures than the result about each of Examples 1 and 2.

It was determined based on the above description that, in electronic component array 10, peel strength $F_2$ in second bonding portion 32 is set to be less than peel strength $F_1$ in first bonding portion 30, and thus, peeling-off of the upper layer portion of base tape 16 is able to be significantly reduced or prevented when cover tape 18 is manually peeled off from base tape 16.

Furthermore, it was determined that, when peel strength $F_2$ in second bonding portion 32 is set at $0.1 \times F_1 \leq F_2 \leq 0.5 \times F$, peeling-off of the upper layer portion of base tape 16 is able to be further significantly reduced or prevented when cover tape 18 is manually peeled off from base tape 16.

Experimental Example 2 was conducted with samples each prepared to include a second bonding portion having a variable length in the length direction. The specifications of each of Examples and Comparative Example are described below. Since Examples 1 and 2 and Comparative Example in Experimental Example 2 are the same or substantially the same as Experimental Example 1, the description thereof will not be repeated.

In the samples of the electronic component arrays in Example 3, first bonding portions 30 each had a peel strength $F_1$ within a range of about 0.2 N or more and about 0.5 N or less, and the average value of peel strengths $F_1$ in first bonding portions 30 was about 0.35 N, and also, second bonding portions 32 each had a peel strength $F_2$ of $$0.1 \times F_1 \leq F_2 \leq 0.7 \times F_1.$$

Furthermore, the length of each of the second bonding portions in the length direction was about 120 mm.

In the samples of the electronic component arrays in Example 4, first bonding portions 30 each had a peel strength $F_1$ within a range of about 0.2 N or more and about 0.5 N or less, and the average value of peel strengths $F_1$ in first bonding portions 30 was about 0.35 N, and also, second bonding portions 32 each had a peel strength $F_2$ of $$0.1 \times F_1 \leq F_2 \leq 0.5 \times F_1.$$

Furthermore, the length of each of the second bonding portions in the length direction was about 120 mm.

Assuming that the number of samples in each of Examples 1 to 4 and Comparative Example was set at 1000 reels, Experimental Example 2 was evaluated based on the number of failures (the number of reels) per 1000 reels.

Table 2 shown below represents the evaluation results about each of Examples 1 to 4 and Comparative Example.

TABLE 2

|  | Length of Second Bonding Surface (mm) | Number of Failures (Number of Pieces) per 1000 Reels |
|---|---|---|
| Comparative Example | 100 | 12 |
| Example 1 | 100 | 5 |
| Example 2 | 100 | 2 |
| Example 3 | 120 | 4 |
| Example 4 | 120 | 1 |

As shown in Table 2, in each of the samples of the electronic component arrays in Example 1, peel strength $F_2$ in the second bonding portion was less than peel strength $F_1$ in the first bonding portion, peel strength $F_2$ in the second bonding portion was $0.1 \times F_1 \leq F_2 \leq 0.7 \times F_1$, and the length of the second bonding portion in the length direction was about 100 mm. Consequently, the number of failures per 1000 reels was 5.

Furthermore, in each of the samples of the electronic component arrays in Example 3, peel strength $F_2$ in the second bonding portion was less than peel strength $F_1$ in first bonding portion 30, peel strength $F_2$ in the second bonding portion was $0.1 \times F_1 \leq F_2 \leq 0.7 \times F_1$, and the length of the second bonding portion in the length direction was about 120 mm. Consequently, the number of failures per 1000 reels was 4. Thus, as the second bonding portion was longer in the length direction, the number of failures was less than that in Example 1.

Furthermore, in each of the samples of the electronic component arrays in Example 2, peel strength $F_2$ in the second bonding portion was $0.1 \times F_1 \leq F_2 \leq 0.5 \times F_1$, and the length of the second bonding portion in the length direction was about 100 mm. Consequently, the number of failures per 1000 reels was 2.

Furthermore, in each of the samples of the electronic component arrays in Example 4, peel strength $F_2$ in the second bonding portion was $0.1 \times F_1 \leq F_2 \leq 0.5 \times F_1$, and the length of the second bonding portion in the length direction was about 120 mm. Consequently, the number of failures per 1000 reels was 1. Thus, as the second bonding portion was longer in the length direction, the number of failures was less than that in Example 1.

On the other hand, in each of the samples of the electronic component arrays in Comparative Example, peel strength $F_2$ in the second bonding portion was substantially the same as peel strength $F_1$ in first bonding portion 30 ($F_1=F_2$). Thus, the number of failures per 1000 reels was 12, which was relatively greater in number of failures than the result about each of Examples 1 to 4.

Thus, it was determined based on the above description that, in electronic component array 10, the second bonding portion is formed to have a length of about 100 mm or more in the length direction, and thereby, peeling-off of the upper layer portion of base tape 16 is able to be further significantly reduced or prevented when cover tape 18 is manually peeled off from base tape 16, and also determined that the second bonding portion is formed to have a length of about 120 mm or more in the length direction, and thereby, peeling-off of the upper layer portion of base tape 16 is able to be further significantly reduced or prevented when cover tape 18 is manually peeled off from base tape 16.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component array comprising:
    a base tape including paper and having an elongated and planar shape, the base tape being provided with a plurality of accommodation recesses provided in a longitudinal direction of the base tape;
    a plurality of electronic components; and
    a cover tape; wherein
    the electronic component array includes:
        a first bonding portion in which openings of the plurality of accommodation recesses are covered by the cover tape in a state where the plurality of electronic components are included in the plurality of accommodation recesses; and
        a second bonding portion in which the openings of the plurality of accommodation recesses are covered by the cover tape in a state where the plurality of electronic components are not included in the respective accommodation recesses; and
    a peel strength of the second bonding portion is 10% or more and 70% or less of a peel strength of the first bonding portion.

2. The electronic component array according to claim 1, wherein the peel strength of the second bonding portion is 10% or more and 50% or less of the peel strength of the first bonding portion.

3. The electronic component array according to claim 1, wherein the second bonding portion has a length of 120 mm or more.

4. The electronic component array according to claim 1, wherein, in the longitudinal direction of the base tape, a bonding area per unit length of the second bonding portion is smaller than a bonding area per unit length of the first bonding portion.

5. The electronic component array according to claim 1, wherein the peel strength of the first bonding portion is between 0.2 N and 0.5 N.

6. The electronic component array according to claim 1, wherein the base tape is a multilayer paperboard including wood pulp.

7. The electronic component array according to claim 6, wherein
- the base tape includes a hardwood pulp material and a softwood pulp material; and
- a blending ratio of the softwood pulp material to the hardwood pulp material is between 10% and 20%.

8. The electronic component array according to claim 1, wherein the base tape includes a plurality of feed holes that are provided in line at a predetermined distance from each other in the longitudinal direction of the base tape.

9. The electronic component array according to claim 1, wherein the first bonding portion and the second bonding portion are provided in the longitudinal direction of the base tape and on outer edges of the plurality of accommodation recesses in a width direction of the base tape.

\* \* \* \* \*